United States Patent
Kaitoh et al.

(10) Patent No.: US 7,727,784 B2
(45) Date of Patent: Jun. 1, 2010

(54) DISPLAY DEVICE AND FABRICATION METHOD THEREOF

(75) Inventors: Takuo Kaitoh, Mobara (JP); Takahiro Kamo, Mobara (JP); Toshihiko Itoga, Chiba (JP)

(73) Assignee: Hitachi Displays, Ltd., Chiba (JP)

( * ) Notice: Subject to any disclaimer, the term of this patent is extended or adjusted under 35 U.S.C. 154(b) by 82 days.

(21) Appl. No.: 12/285,997

(22) Filed: Oct. 17, 2008

(65) Prior Publication Data

US 2009/0061575 A1    Mar. 5, 2009

Related U.S. Application Data

(62) Division of application No. 11/590,882, filed on Nov. 1, 2006, now Pat. No. 7,456,433.

(30) Foreign Application Priority Data

Nov. 14, 2005  (JP) .............................. 2005-328865

(51) Int. Cl.
*H01L 21/00* (2006.01)

(52) U.S. Cl. .............................. 438/22; 438/167; 257/72
(58) Field of Classification Search .................... 438/22
See application file for complete search history.

(56) References Cited

U.S. PATENT DOCUMENTS

| | | | |
|---|---|---|---|
| 5,589,694 | A | 12/1996 | Takayama et al. |
| 5,920,097 | A | 7/1999 | Horne |
| 6,303,963 | B1 | 10/2001 | Ohtani et al. |
| 6,737,672 | B2 | 5/2004 | Hara et al. |
| 6,756,614 | B2 | 6/2004 | Hatano et al. |
| 6,943,086 | B2 | 9/2005 | Hongo et al. |
| 2001/0034093 | A1 | 10/2001 | Matsuzaki et al. |
| 2002/0040981 | A1 | 4/2002 | Yamazaki et al. |
| 2003/0122129 | A1* | 7/2003 | Yamazaki et al. ............. 257/64 |
| 2003/0201493 | A1 | 10/2003 | Ohuchi et al. |
| 2004/0041158 | A1 | 3/2004 | Hongo et al. |
| 2004/0072411 | A1 | 4/2004 | Azami et al. |

* cited by examiner

*Primary Examiner*—Kenneth A Parker
*Assistant Examiner*—Anthony Ho
(74) *Attorney, Agent, or Firm*—Stites & Harbison PLLC; Juan Carlos A. Marquez, Esq.

(57) ABSTRACT

The present invention provides a display device which forms thin film transistor circuits differing in characteristics from each other on a substrate in mixture and a fabrication method of the display device. On a glass substrate having a background layer which is formed by stacking an SiN film and an $SiO_2$ film, a precursor film which is constituted of an a-Si layer or a fine particle crystalline p-Si layer is formed and the implantation is applied to the precursor film. Here, an acceleration voltage and a dose quantity are adjusted such that a proper quantity of dopant is dosed in the inside of the precursor film. When the precursor film is melted by laser radiation, the dopant dosed in the precursor film is activated and taken into the precursor.

14 Claims, 16 Drawing Sheets

DISPLAY DEVICE AND FABRICATION METHOD THEREOF

CROSS REFERENCE TO RELATED APPLICATIONS

This application is a Divisional of nonprovisional U.S. application Ser. No. 11/590,882 filed on Nov. 1, 2006 now U.S. Pat. No. 7,456,433. Priority is claimed based on U.S. application Ser. No. 11/590,882 filed on Nov. 1, 2006, which claims the priority of Japanese Application 2005-328865 filed on Nov. 14, 2005, all of which is incorporated by reference.

BACKGROUND OF THE INVENTION

The present invention relates to a fabrication method of a flat-panel-type display device, and more particularly to a display device which can form a large number of thin film transistors which differ in operational characteristics on a substrate with small number of steps and a fabrication method thereof.

Flat-panel-type display devices adopting various methods such as a display device capable of performing a high-definition color display for a notebook type computer or a display monitor, a liquid crystal display device which uses a liquid crystal panel as a display panel for a mobile phone, an organic electroluminescence display device (organic EL display device) which uses electroluminescence (particularly organic electroluminescence) elements or a field emission type display device (FED) which uses field emission elements have been already put into practice or in the process of studies for putting the display device into practice.

With respect to the flat-panel-type display device, there has been developed a so-called system-in-panel which directly builds a display region on which a large number of pixels which are constituted of a thin film transistor circuit are arranged in a matrix array and peripheral circuits (including for example, a scanning signal drive circuit, a video signal drive circuit for driving the pixels and other peripheral circuits which are arranged around the display region) and the like in an insulating substrate made of glass or the like. The transparent insulating substrate in which various kinds of thin film transistor circuits are built is also referred to as a thin film transistor (TFT) substrate or an active matrix substrate, wherein in general, the thin film transistors having various characteristics are built in the substrate using a low-temperature poly silicon semiconductor film. The substrate in which the thin film transistors are built in is also expressed as the TFT substrate or simply as the substrate in the explanation made hereinafter.

In building the pixel circuits which form the display region on the same substrate which constitutes the flat-panel-type display device and, at the same time, in building a large number of thin film transistor circuits including peripheral circuits (for example, the scanning signal drive circuit, the video signal drive circuit and other peripheral circuits) in a periphery of the substrate, channel regions which have threshold voltages which differ in response to operational performances of the respective circuits are formed on semiconductor layers of the same substrate.

As one method, there has been proposed a method in which a semiconductor layer of a thin film transistor forming portion of the circuit which does not require a high speed operation is formed of a poly silicon (p-Si) layer (having a relatively large particle size) (for example, formed by annealing using an excimer laser (ELA) using an amorphous silicon (a-Si) layer or a fine crystal poly-silicon layer as a precursor), and a channel region of the circuit which requires a high-speed operation is selectively pseudo-single-crystallized to form a pseudo-single-crystalline silicon semiconductor layer using a solid laser, a continuous oscillation laser or the like. Here, the pseudo-single-crystalline silicon semiconductor layer implies, although described in detail later, a semiconductor layer which grows relatively large crystals (having a strip-like shape, for example) compared to usual poly-silicon crystals which constitute so-called granular crystals but are not regarded as single crystals.

When the TFTs which differ in characteristics, that is, the TFTs which are built in the poly-silicon semiconductor film formed by a technique such as ELA, and the TFTs which are built in the pseudo-single-crystalline silicon semiconductor layer formed by using a solid laser, a continuous oscillation laser or the like are allowed to coexist on the same substrate, it is necessary to control the characteristics (mainly threshold voltages) of the respective TFTs.

Here, patent documents which disclose the related art on the pseudo-single-crystals, for example, J-P-A-2002-222959 (patent document 1), J-P-A-2003-124136 (patent document 2), J-P-A-2003-086505 (patent document 3) can be named.

SUMMARY OF THE INVENTION

As described above, the threshold voltage is, in general, controlled by the method in which impurities (also referred to as dopants) are dosed into the channel portion by ion implantation and the region where the impurities are dosed is controlled in combination with a photolithography step (a forming method which uses exposure and etching processing).

However, in building the large number of thin film transistors which differ in characteristics (threshold values) in the silicon semiconductor layer on the common substrate, compared to the case in which the thin film transistors having the same characteristics are built in the silicon semiconductor layers, photolithography steps and the implantation steps are largely increased and hence, facilities and time necessary for the fabrication are increased thus lowering the so-called throughput.

For example, to consider the thin film transistor of a single channel (only one of n-type or p-type), when it is necessary to make the threshold value of the thin film transistor which uses the usual poly-silicon (p-Si) in the pixel and the threshold value of the thin film transistor which uses the pseudo-single-crystals in the drive circuit different from each other, one thin film transistor (for example, the thin film transistor in the pixel) is masked by a photolithography step and the implantation is applied to the channel region of the thin film transistor of the pseudo-single-crystals.

Also in case that the thin film transistor is formed of a C-MIS (Complementary Metal insulator Semiconductor) (here, the MIS being used as a concept which includes a MOS), the n-type thin film transistors and the p-type thin film transistors exist in mixture and hence, it is necessary to perform the photolithography steps and the implantation steps for making the threshold values of the n-type thin film transistors and the p-type thin film transistors different from each other.

Accordingly, it is an object of the present invention to provide a display device which can form thin film transistor circuits which differ in characteristics from each other on a substrate in mixture and a fabrication method of the display device.

According to the present invention, an amorphous silicon (a-Si) layer or a fine crystalline poly-silicon (p-Si) layer is used as a precursor film and ion implantation is applied to the precursor film. Here, an acceleration voltage and a dose quantity are adjusted to dose a proper quantity of dopant into the inside of the precursor film.

When the precursor film is melted by laser beam irradiation, the dopant contained in the inside of the precursor film is activated and is taken into the inside of the film. Further, the activation is performed simultaneously with the crystallization and it is possible to obtain an activation ratio of approximately 100%.

A quantity of the dopant dosed into the film is calculated by conversion with respect to the activation ratio of 100% and may be smaller than a conventional dose quantity. Assume the activation ratio based on the conventional method as 10%, and a channel doped quantity is $1E^{12}/cm^2$ and the doped quantity which actually contributes as the dopant is approximately $1E^{11}/cm^2$. On the other hand, in performing the ion implantation before crystallization, the implantation condition may be set such that the dose quantity of approximately $1E^{11}/cm^2$ is dosed.

The dopant is taken into the inside of the film only at a portion of the film to which the laser beams are radiated. Accordingly, it is possible to obtain an advantageous effect as same as the advantageous effect of the method which performs the ion implantation only on the necessary portion using a photolithography step.

Although the dopant dosed into the non-crystallized portion is partially activated by annealing which is performed in a succeeding step, the dose quantity in the film is originally small and hence, the dopant does not constitute the change of characteristics (fluctuation of a threshold value).

To describe specific constitutional examples of the display device and the fabrication method of the display device according to the present invention for achieving the above-mentioned object, they are as follows.

First of all, a fabrication method of a display device which forms a first thin film transistor which is formed in a first region and has a first threshold value, and a second thin film transistor which is formed in a second region and has a second threshold value which differs from the first threshold value on a substrate which constitutes the display device is a fabrication process which includes:

a semiconductor film forming step which forms a semiconductor film;

a first impurity implanting step for implanting first impurities for a threshold value control in the semiconductor film which is formed in the first region and the second region;

a first crystallizing step for performing the crystallization of the semiconductor film and the activation of the first impurities in the first region and the second region by applying heat treatment to the semiconductor film in the first region and the second region;

a second impurity implanting step for implanting second impurities for a threshold value control in the semiconductor film in the first region and the second region after the first crystallizing step; and a second crystallizing step for performing the crystallization of the semiconductor film of the second region and the activation of the second impurities by applying heat treatment only to the semiconductor film in the second region out of the semiconductor films in the first region and the second region.

Further, a display device according to the present invention which forms a first thin film transistor which is formed in a first region and has a first threshold value, and a second thin film transistor which is formed in a second region and has a second threshold value which differs from the first threshold value is characterized in that first impurities and second impurities are implanted into both of a channel region of the first thin film transistor and a channel region of the second thin film transistor;

the first impurities have a large activation ratio (90% or more in a numerical value) which activates substantially a total quantity of impurities in both of the channel region of the first thin film transistor and the channel region of the second thin film transistor; and the second impurities have an activation ratio (50% or less in a numerical value) which activates substantially a half quantity of impurities at maximum in the channel region of the first thin film transistor and has a large activation ratio (90% or more in a numerical value) which activates substantially a total quantity of impurities in the channel region of the second thin film transistor.

Further, in the fabrication method according to the present invention, the first crystallizing step may be a step in which the crystallization is performed by radiating laser beams (gas laser beams, solid laser beams or the like) to the semiconductor film, a step in which the crystallization is performed by radiating excimer laser beams or solid laser beams to the semiconductor film, or a step in which the crystallization is performed by growing a solid phase by heating the semiconductor film.

Further, in the fabrication method according to the present invention, the second crystallizing step may be any one of a step in which the crystallization is performed by radiating laser beams to the semiconductor film, a step in which the crystallization is performed by radiating continuous oscillation laser beams to the semiconductor film, a step in which the crystallization is performed by radiating continuous oscillation laser beams to the semiconductor film while modulating the laser beams to pulses, and a step in which while continuous oscillation laser beams are radiated to the semiconductor film, the scanning of the continuous oscillation laser beams is performed by moving at least either one of a spot of the continuous laser beams or a substrate on which the semiconductor film is formed thus forming strip-like crystals.

In the fabrication method of the present invention, the second impurity implanting step may perform the implantation such that a peak position of the concentration of the second impurities is arranged outside the semiconductor film. Due to such a constitution, it is possible to decrease a dose quantity in the second impurity implanting step smaller than a dose quantity in the first impurity implanting step.

Further, in the fabrication method of the present invention, at least one of the first impurities and the second impurities may be implanted without through an insulation film. On the other hand, at least one of the first impurities and the second impurities may be implanted through the insulation film.

Alternatively, after at least one out of the first impurities and the second impurities is implanted through the insulation film, the insulation film may be removed before the crystallization of the semiconductor film. Further, the insulation film is removed after the first impurities are implanted through the insulation film and, then, after the removal of the insulation film, a surface oxide film is formed on a surface of the semiconductor film, and after the formation of the surface oxide film, the first crystallizing step is performed.

Further, in the display device of the present invention, the activation ratio of the second impurities in the channel region of the first thin film transistor may be approximately ⅓ (equal to or less than 30% numerically) at the maximum implanted quantity, and the channel region of the first thin film transistor is formed of a semiconductor film made of granular crystal or fine crystal.

Further, in the display device of the present invention, the channel region of the second thin film transistor is formed of a semiconductor film made of strip-like crystal.

Further, in the display device of the present invention, a peak position of the concentration of the second impurities may be positioned away from the semiconductor film which constitutes the channel region.

Further, in the display device of the present invention, a dose quantity of the first impurities may be set larger than a dose quantity of the second impurities. Here, the first impurities and the second impurities may be equal or different from each other.

Further, the present invention is not limited to the above-mentioned constitutions and can be properly changed without departing from the technical concept of the present invention.

According to the present invention, a region in which pseudo single crystallization is performed is selectively set only to a portion in which the thin film transistor of the required high mobility characteristics is built. Then, in combination with the laser beam irradiation step, a required dopant is selectively dosed only into the precursor film of the portion where the pseudo-single-crystal thin film transistors are arranged. Although the dopant is dosed also into a portion to which the laser beams are not radiated, a dose quantity is small and hence, a threshold value is not changed. Even when kinds of thin film transistors (n-MOS, p-MOS) are increased, it is possible to cope with the increase of the kinds of thin film transistors by repeating the ion implantation and the crystallization. Accordingly, it is unnecessary to increase photolithography steps thus improving the so-called throughput.

DESCRIPTION OF THE PREFERRED EMBODIMENTS

Hereinafter, embodiments of the present invention are explained in detail in conjunction with drawings showing the embodiments. Hereinafter, a substrate which forms a semiconductor layer is formed of a glass substrate.

Embodiment 1

Figure 1A:
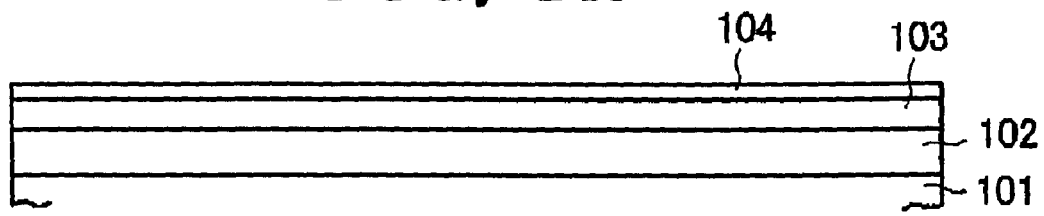
FIG. 1A to FIG. 1W describe a flow chart showing fabrication steps of a thin film transistor for explaining an embodiment 1 of a fabrication method of a display device according to the present invention in order.
Figure 1B:
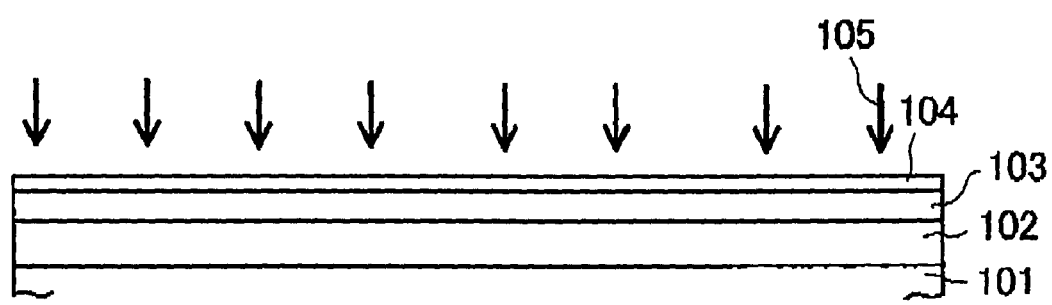
Figure 1C:
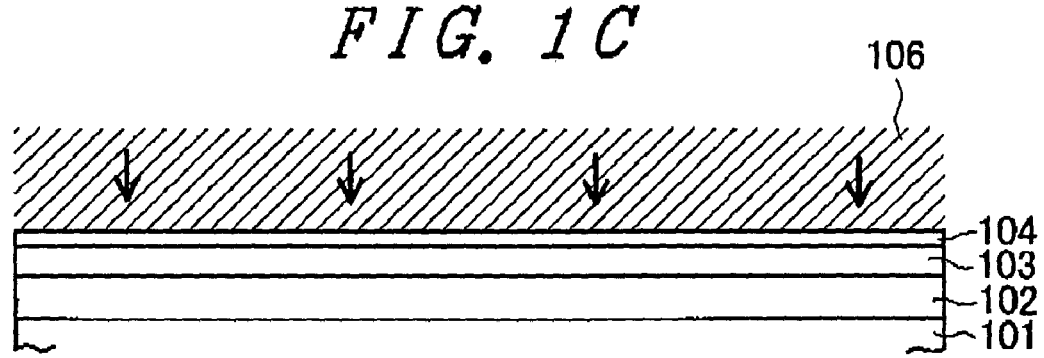
Figure 1D:
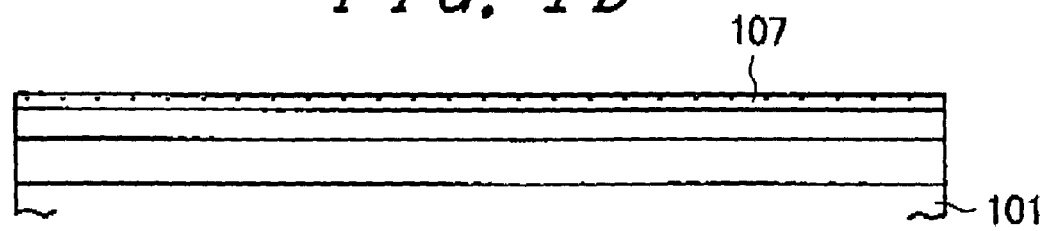
Figure 1E:
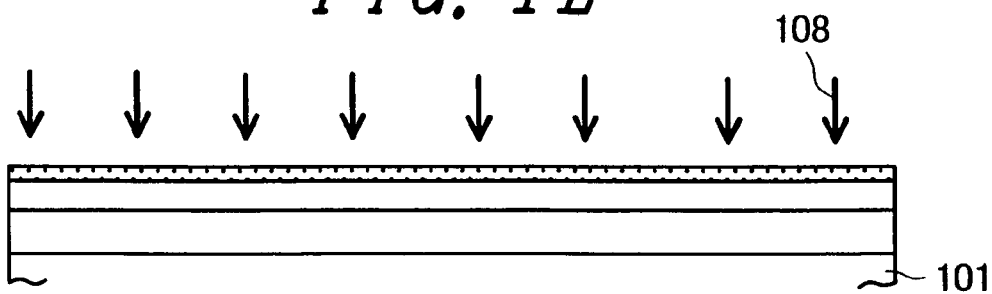
Figure 1F:
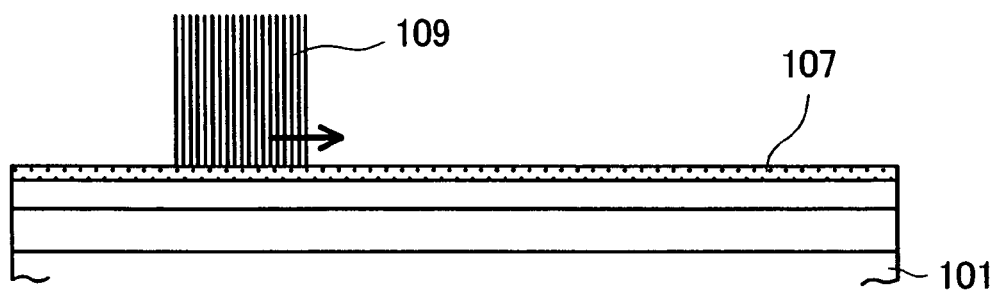
Figure 1G:
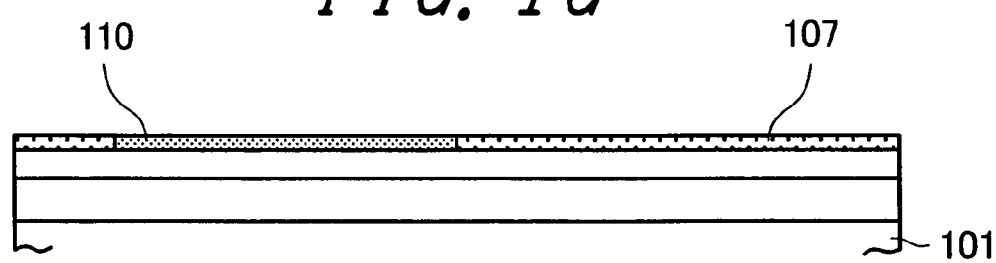
Figure 1H:
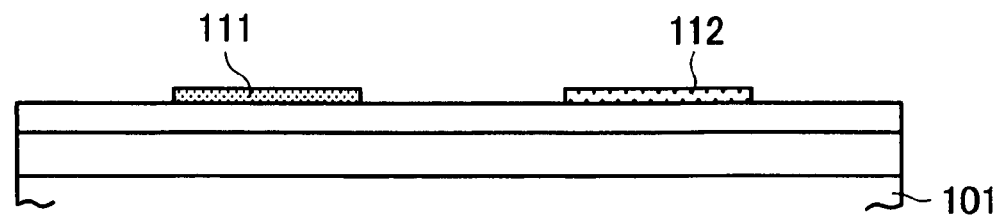
Figure 1I:
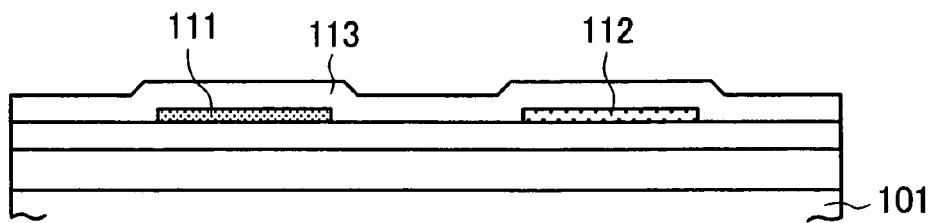
Figure 1J:
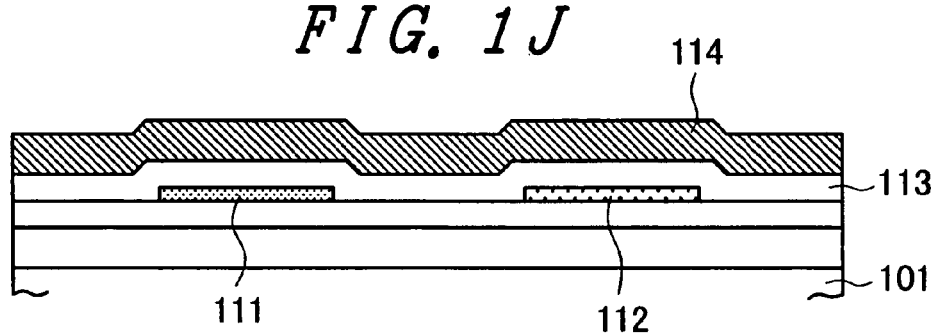
Figure 1K:
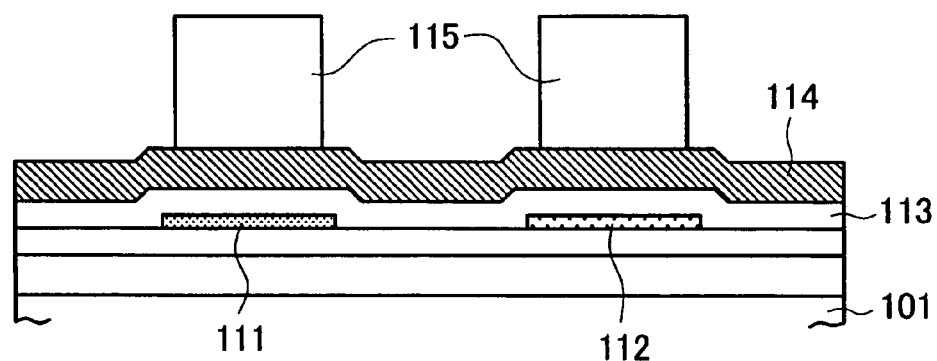
Figure 1L:
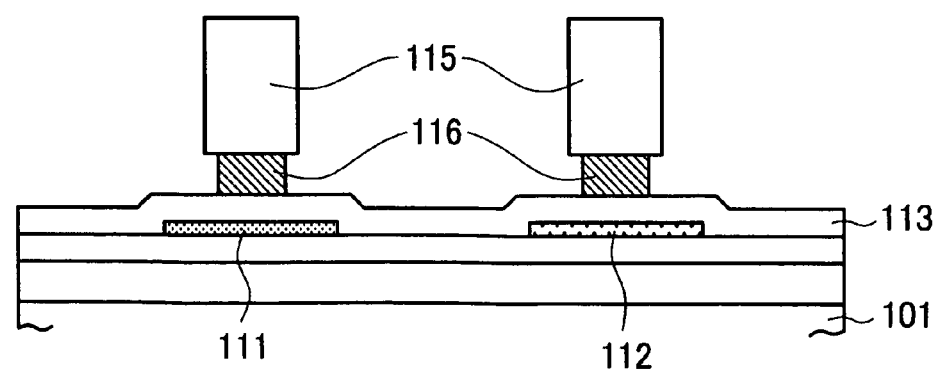
Figure 1M:
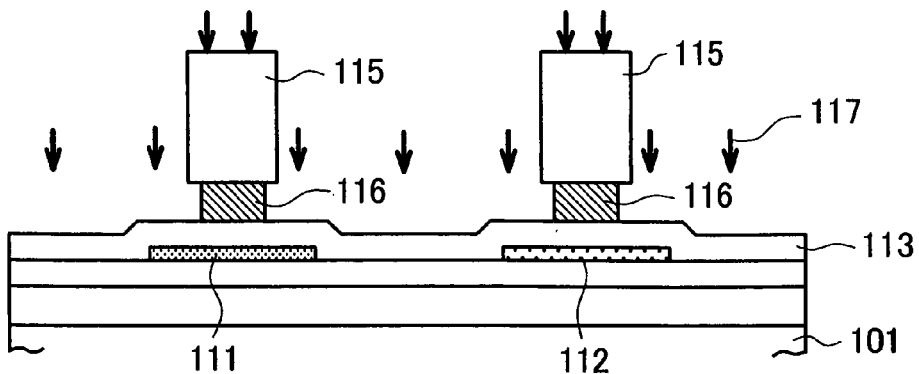
Figure 1N:
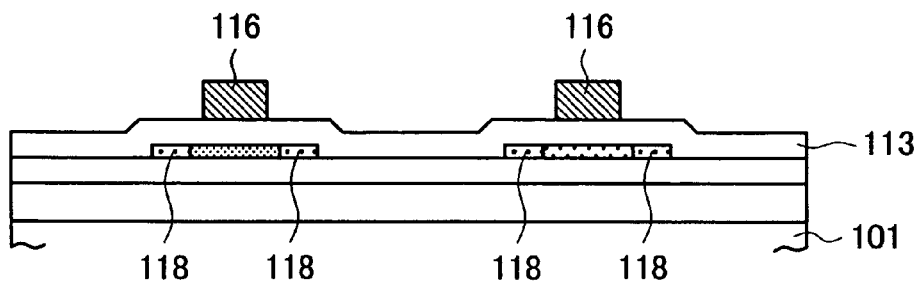
Figure 1O:
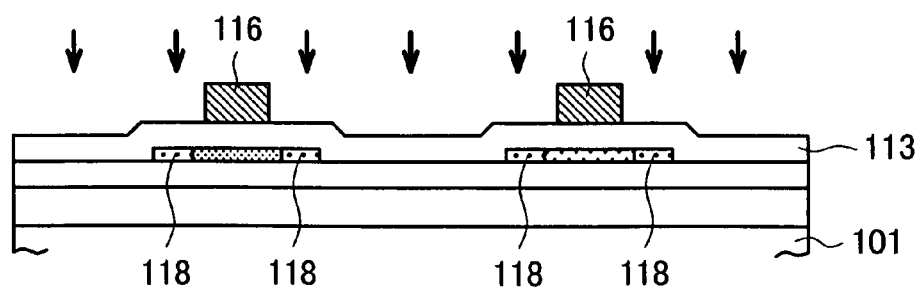
Figure 1P:
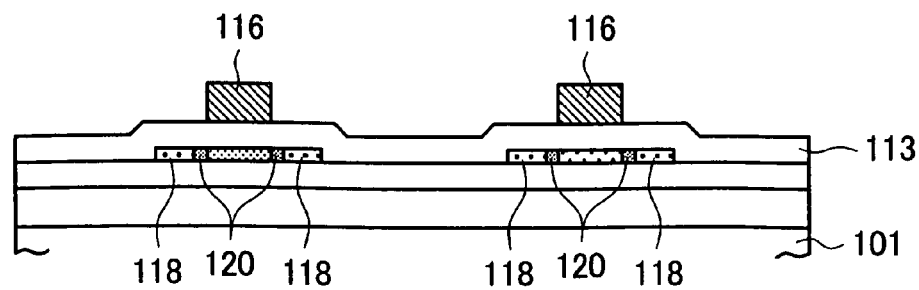
Figure 1Q:
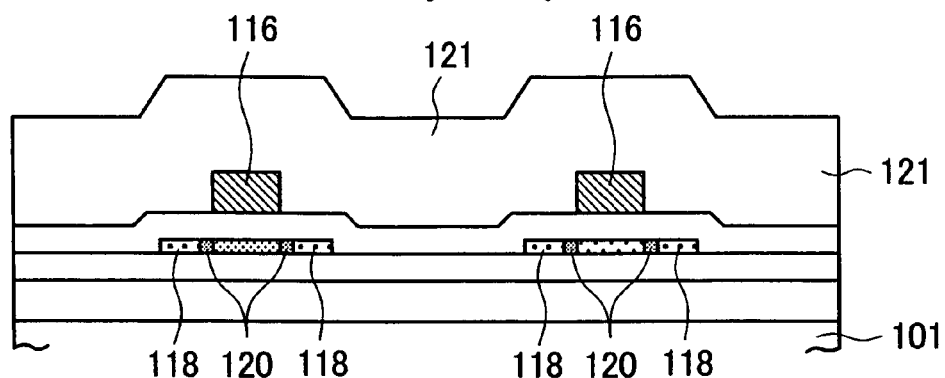
Figure 1R:
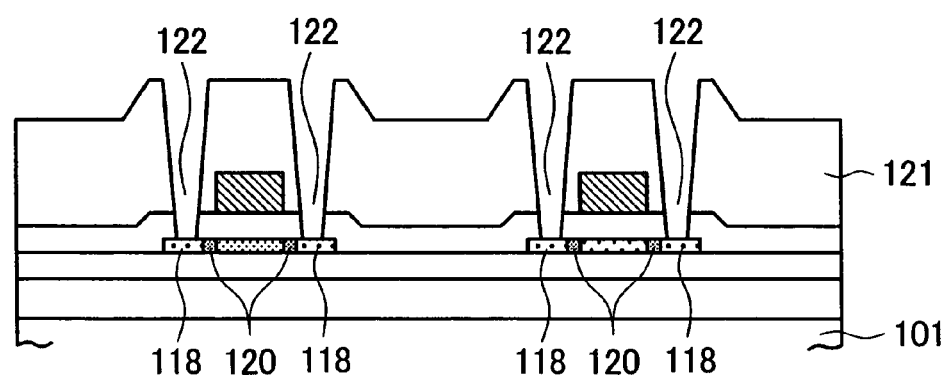
Figure 1S:
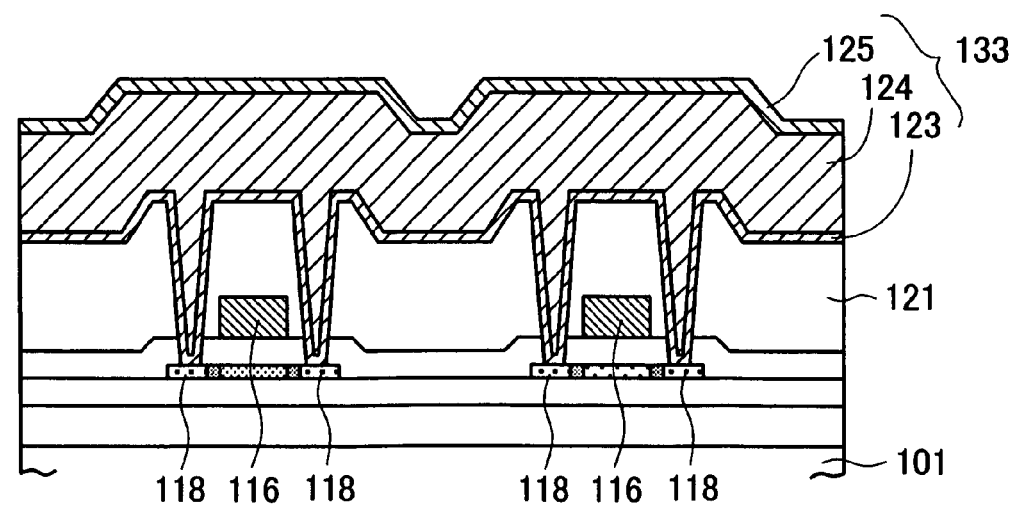
Figure 1T:
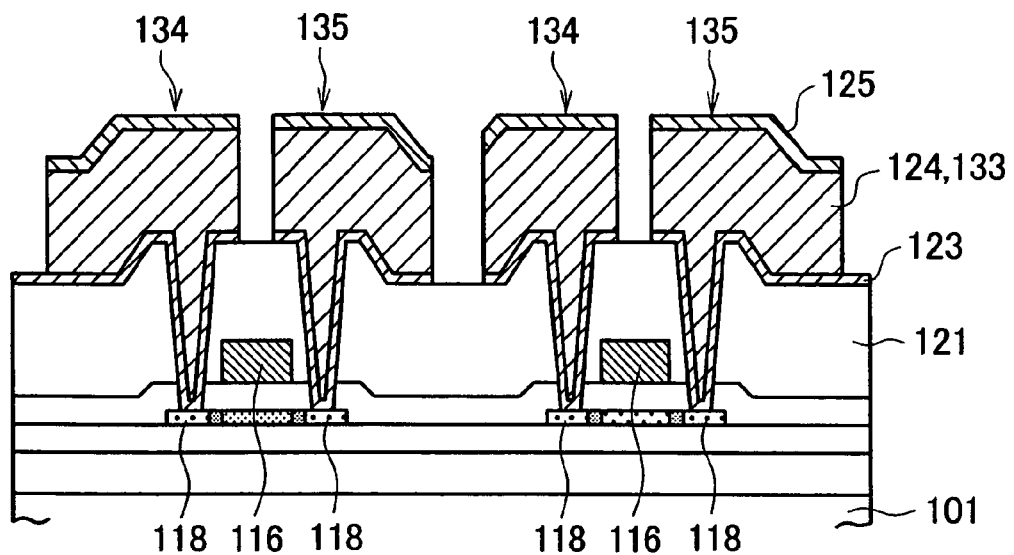
Figure 1U:
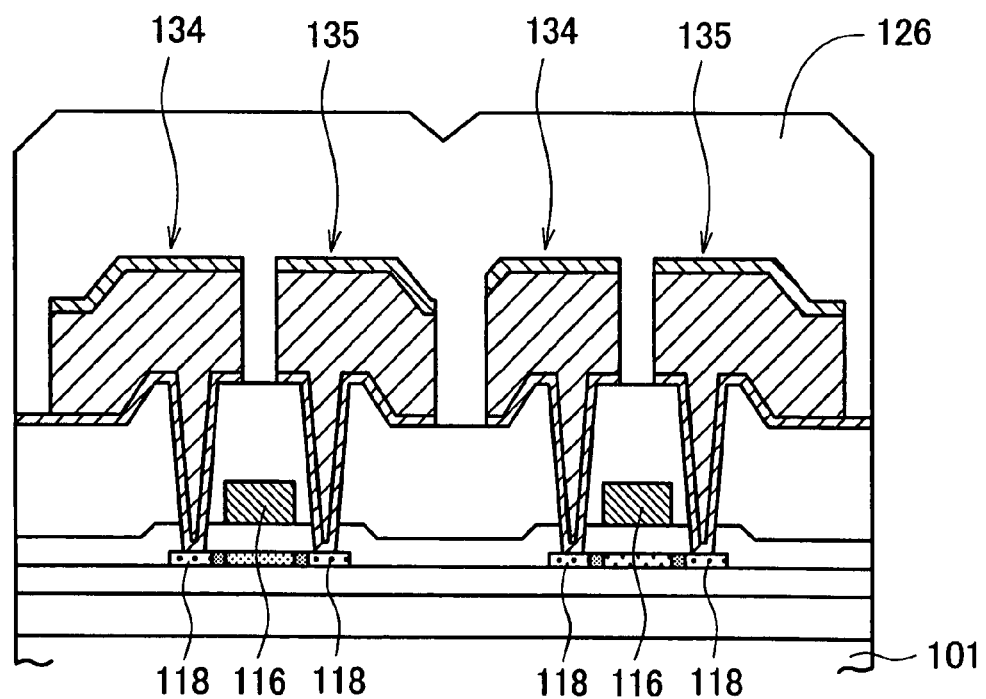
Figure 1V:
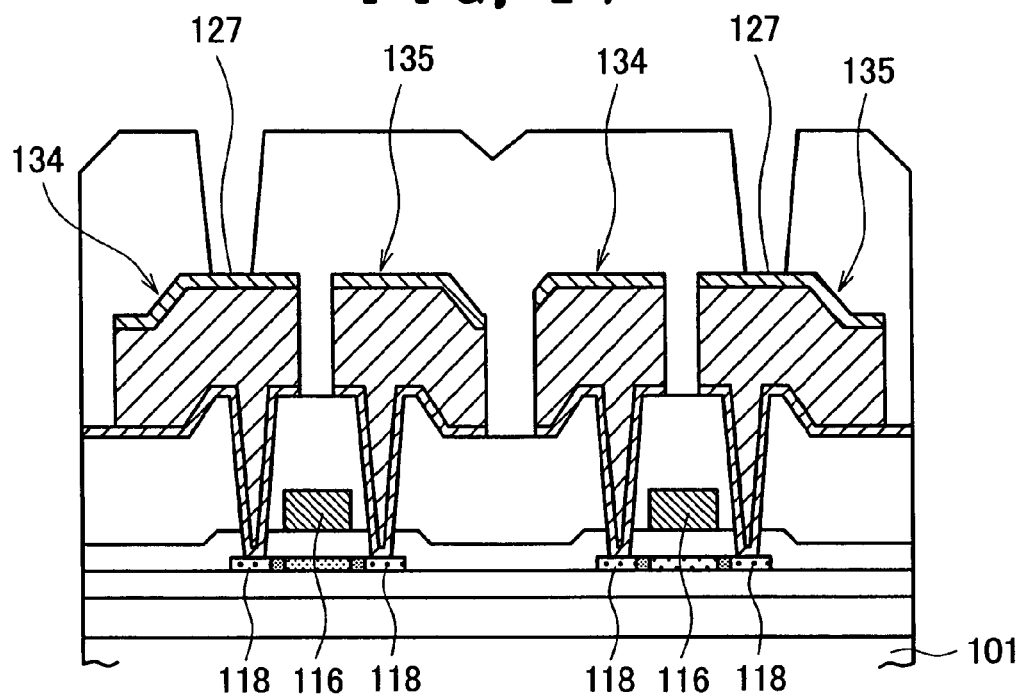
Figure 1W:
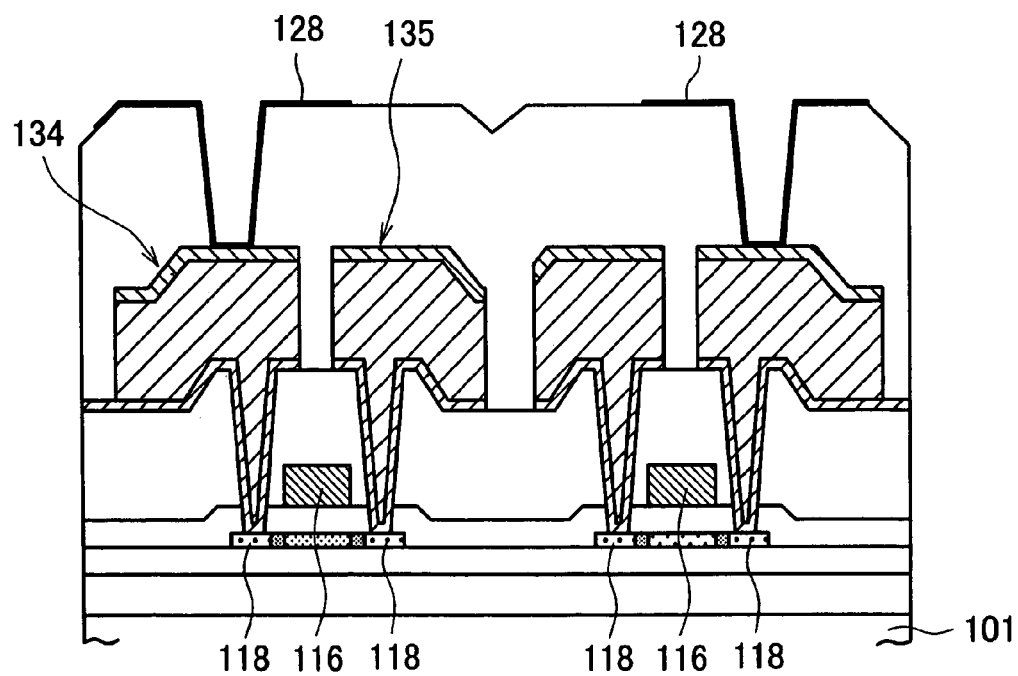

FIG. 1A to FIG. 1W are cross-sectional views for explaining an embodiment 1 of a fabrication method of a display device according to the present invention and shows a fabrication process flow of an n-MOS top gate thin film transistor. Here, in order to explain the fabrication process flow by comparing the n-MOS top gate thin film transistor with a thin film transistor having different characteristics which is formed on the same substrate, a fabrication process of the thin film transistor of high mobility (high-performance thin film transistor) at a left side in each drawing and a fabrication process of the usual thin film transistor at a right side in each drawing are shown in parallel to each other.

FIG. 1A . . . An SiN layer 102 and an $SiO_2$ layer 103 are formed as a background layer on a glass substrate 101, and an amorphous silicon film (a-Si) film 104 is formed on the SiN layer 102 and the $SiO_2$ layer 103 by a plasma CVD method. The heat treatment is applied to the stacked structure to remove hydrogen in the inside of the a-Si film 104.

FIG. 1B . . . Into the a-Si film 104, a dopant 105 (mainly $B^+$) for controlling a threshold voltage (Vth) of a n-MOS thin film transistor (TFT) using a polycrystalline (p-Si) semiconductor film is implanted (first implantation).

FIG. 1C . . . After implanting the dopant 105, excimer laser beams 106 are radiated to reform the a-Si film into a p-Si film 107 (being polycrystallized, excimer laser annealing: ELA). Here, the activation is simultaneously applied to the dopant which is dosed into the a-Si film 104 which functions as a precursor film.

FIG. 1D . . . The p-Si film 107 is formed. Here, the dopant 105 which is implanted for controlling the threshold voltage (Vth) is activated by substantially 100%.

FIG. 1E . . . A dopant 108 for controlling a threshold voltage of an n-MOS pseudo-single-crystalline thin film transistor (TFT) is implanted into the p-Si film 107 (second implantation).

FIG. 1F . . . The pseudo-single-crystallization is performed by annealing a predetermined region of the p-Si film 107 with solid laser beams 109 or the like. The polycrystallization and the activation of the dopant 108 are simultaneously performed. The activation of the dopant 108 is performed only with respect to a region which is annealed with laser beams. An arrow indicates the scanning direction of laser beams for annealing. An arrow indicates the scanning direction of laser beams for annealing.

FIG. 1G . . . The region which is annealed by the solid laser beams constitutes a pseudo-single-crystalline silicon semiconductor film 110.

FIG. 1H . . . After finishing the crystallization, the pseudo-single-crystalline silicon semiconductor film 110 is formed in an island-like shape thus forming a channel layer 112 formed of a polycrystalline silicon thin film transistor and a channel layer 111 made of pseudo-single-crystalline silicon thin film transistor.

FIG. 1I . . . An $SiO_2$ film 113 which constitutes a gate insulation film is formed by a plasma CVD method on the channel layer 111 of the pseudo-single-crystalline silicon thin film transistor and the channel layer 112 of the polycrystalline silicon thin film transistor which are formed in an island shape.

FIG. 1J . . . A gate metal layer 114 which becomes gate lines and capacitance lines is formed.

FIG. 1K . . . A photo resist 115 is applied to the gate metal layer 114 and forming is performed to allow the photo resist 115 to remain at predetermined positions by a photolithography step.

FIG. 1L . . . A gate electrode 116 is formed by forming the gate metal layer 114 by etching. Here, a width of the gate electrode 116 is set smaller than a width of the photo resist 115 by side etching.

FIG. 1M . . . An implantation ($P^+$) for forming source/drain regions is performed using the photo resist 115 as a mask.

FIG. 1N . . . Source/drain regions 118 are formed in the semiconductor film.

FIG. 1O . . . To form LDD (Light Doped Drain) regions, the impurities ($P^+$) 119 of low concentration are implanted to the whole source/drain regions 118 using the gate electrode 116 as a mask.

FIG. 1P . . . The LDD regions 120 are formed in the source/drain regions 118 by the implantation of the impurities ($P^+$) 119.

FIG. 1Q . . . An interlayer insulation film 121 is formed and annealing treatment for activating the implanted impurities is performed.

FIG. 1R . . . Contact holes 122 are formed in the interlayer insulation film 121 by a photolithography step. The contact holes 122 are formed in a state that the contact holes 122 reach the source/drain regions 118.

FIG. 1S . . . A barrier layer 123, an aluminum layer 124 and a cap layer 125 are sequentially stacked thus forming a source/drain line 133. The source/drain line 133 is connected with the source/drain regions 118 via the contact holes 122.

FIG. 1T . . . The source/drain line 133 is formed by a photolithography step thus separating a source electrode 134 and a drain electrode 135. Here, for facilitating the explanation, the source electrode is indicated by 134 and the drain electrode is indicated by 135.

FIG. 1U . . . A passivation film 126 is formed in a state that the passivation film 126 covers the source electrode 134 and the drain electrode 135 which are separated from each other.

FIG. 1V . . . As conductive layers, a contact hole 127 with a transparent electrode made of ITO or the like and opening portions for pads not shown in the drawing are formed by a photolithography step.

FIG. 1W . . . An ITO film which is connected with the source electrode 134 via the contact hole 127 and is connected with line terminals via the opening portions for pads not shown in the drawing is formed on the passivation film 126 and, ITO films which are respectively connected with a source and a drain electrode of the thin film transistor respectively are formed by a photolithography step.

Due to the above-mentioned process of the embodiment 1, it is possible to form the thin film transistors having different characteristics from each other which constitute channels being controlled at different threshold voltages by silicon semiconductor films which have different crystals on the same substrate.

According to the fabrication method of the embodiment 1, the thin film transistor which possesses the normal mobility constitutes a pixel circuit in the pixel region on the active matrix substrate of the display device. Then, various circuits are constituted by using the thin film transistor which possesses high mobility in the drive circuit region which requires the high-speed data processing such as data driving circuits. Accordingly, it is possible to constitute the display device having the desired display performance without giving rise to the increase of the number of steps.

Embodiment 2

FIG. 2A to FIG. 2J are cross-sectional views for explaining an embodiment 2 of a fabrication method of a display device according to the present invention and shows a fabrication process flow of an n-MOS top gate thin film transistor in the same manner as the embodiment 1.

In this embodiment 2, before implanting the impurities, an insulation film is formed over the semiconductor and the implantation is performed through the insulation film. Such an insulation film may be made of $SiO_2$, for example. This insulation film allows the impurities which are implanted to pass therethrough and, at the same time, has a function of protecting the semiconductor to be implanted with impurities from the contamination and hence, the insulation film may be also referred to as an implantation through film or a contamination prevention film. The formation of the insulation film on the semiconductor film is performed before either one of the first-time implantation for controlling threshold value or the second-time implantation for controlling threshold value or before both of these processes. Here, it is preferable to perform the removal of the insulation film after the implantation. Hereinafter, the explanation is made by focusing on the process which makes the embodiment 2 differ from the embodiment 1.

Figure 2A:
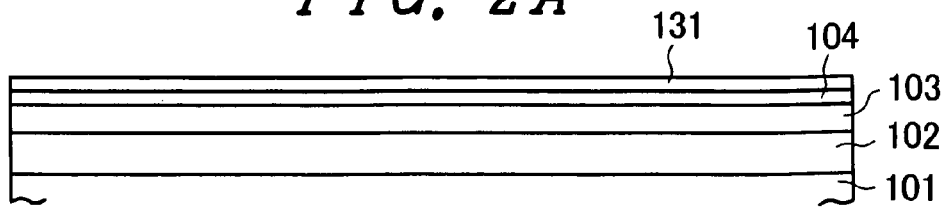
FIG. 2A to FIG. 2J describe a flow chart showing fabrication steps of a thin film transistor for explaining an embodiment 2 of a fabrication method of a display device according to the present invention in order.

FIG. 2A . . . An SiN layer 102 and an $SiO_2$ layer 103 are formed as a background layer on a glass substrate 101, and an amorphous silicon (a-Si) film 104 is formed on the SiN layer 102 and the $SiO_2$ layer 103 and, further, a $SiO_2$ film 131 is formed by a plasma CVD method. The heat treatment is applied to the stacked structure to remove hydrogen in the inside of the a-Si film 104.

Figure 2B:
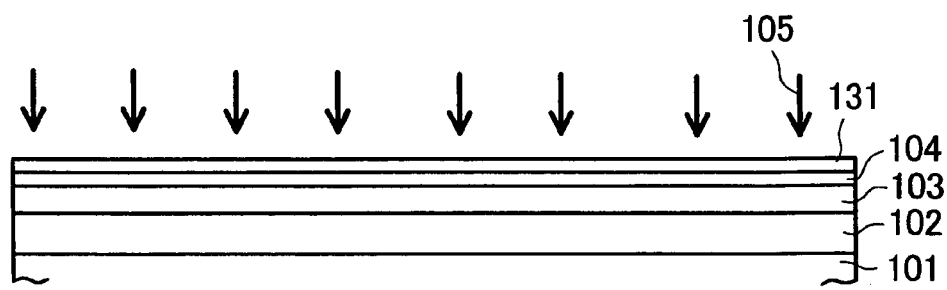

FIG. 2B . . . A dopant 105 (mainly $B^+$) for controlling a threshold voltage (Vth) of an n-MOS thin film transistor (TFT) using a polycrystalline (p-Si) semiconductor film is implanted into the a-Si film 104 through the $SiO_2$ film 131 (first implantation).

Figure 2C:
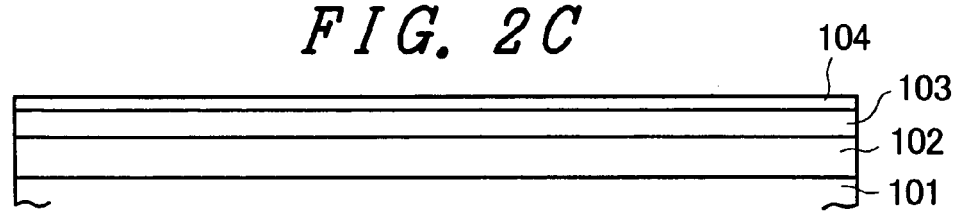

FIG. 2C . . . The a-Si film 104 is exposed by removing the $SiO_2$ film 131.

Figure 2D:
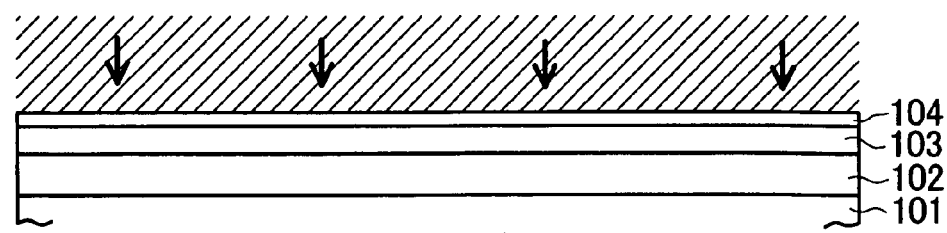

FIG. 2D . . . After exposing the a-Si film 104, in the same manner as the process shown in FIG. 1C in the embodiment 1, excimer laser beams 106 are radiated to reform the a-Si film into a p-Si film 107 (being polycrystallized). Here, the activation is simultaneously applied to the dopant which is dosed into the a-Si film 104 which functions as a precursor film.

Figure 2E:
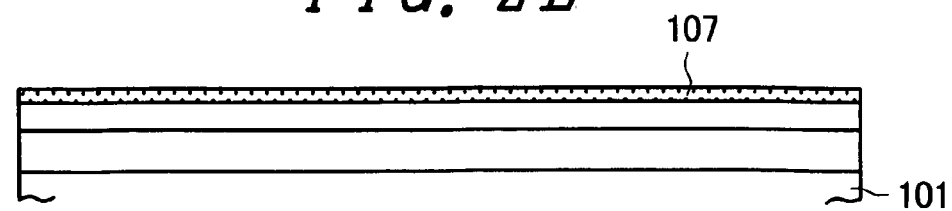

FIG. 2E . . . The p-Si film 107 is formed. Here, the dopant 105 which is implanted for controlling the threshold voltage (Vth) is activated by 100%. This process is substantially equal to the process shown in FIG. 1D.

Figure 2F:
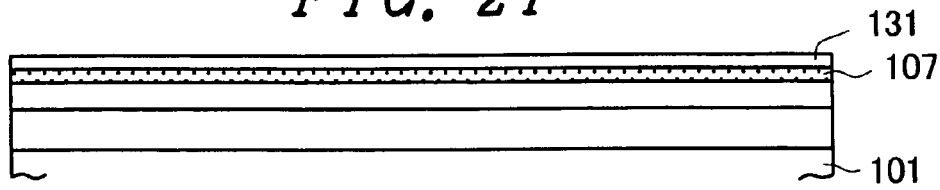

FIG. 2F . . . An $SiO_2$ film 131 similar to the $SiO_2$ film 131 in FIG. 2A is formed in a state that the $SiO_2$ film 131 covers the p-Si film 107. When necessary, heat treatment is applied to the silicon film 131 to remove hydrogen in the a-Si.

Figure 2G:
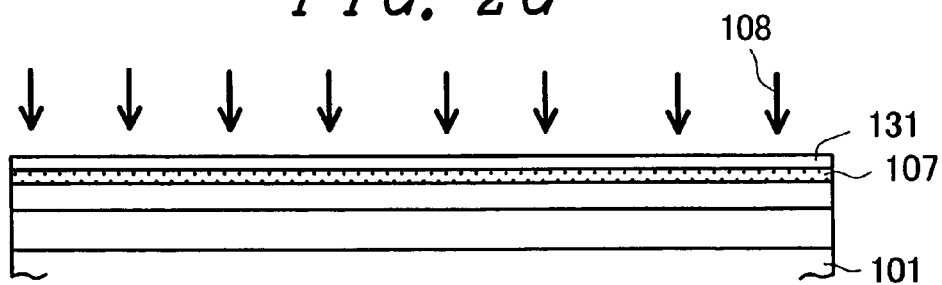

FIG. 2G . . . A dopant 108 for controlling a threshold voltage of an n-MOS pseudo-single-crystalline thin film transistor (TFT) is implanted into the p-Si film 107 through the SiO$_2$ film 131 (second implantation).

Figure 2H:
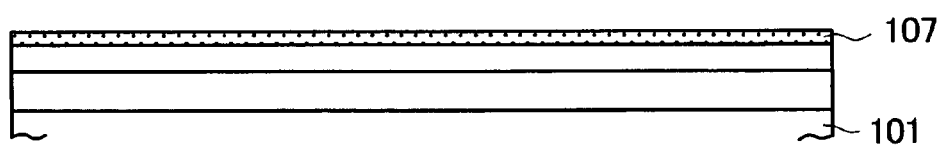

FIG. 2H . . . The p-Si film 107 is exposed by removing the SiO$_2$ film 131.

Figure 2I:
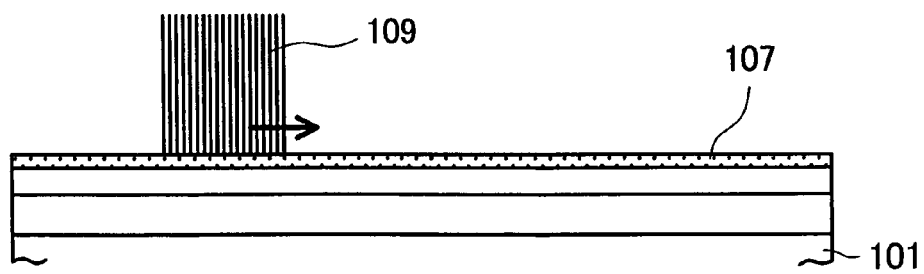

FIG. 2I . . . The pseudo-single-crystallization is performed by annealing a predetermined region of the p-Si film 107 with solid laser beams 109 or the like. The polycrystallization and the activation of the dopant 108 are simultaneously performed. The activation of the dopant 108 is performed only with respect to a region which is annealed with laser beams. An arrow indicates the scanning direction of the laser beams for annealing.

Figure 2J:
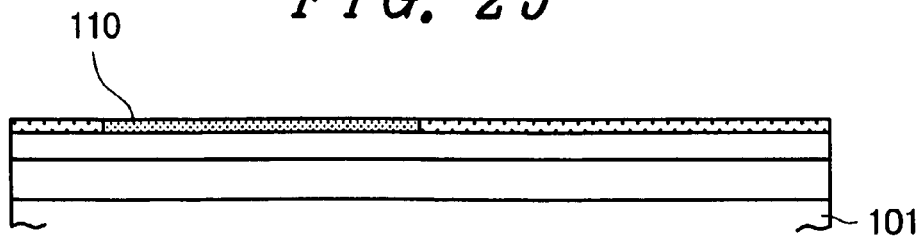

FIG. 2J . . . The region which is annealed by the solid laser beams constitutes a pseudo-single-crystalline silicon semiconductor film 110. Hereinafter, by performing the process shown in FIG. 1H to FIG. 1W, it is possible to form the thin film transistors having different characteristics from each other which constitute channels being controlled at different threshold voltages by silicon semiconductor films which have different crystals on the same substrate.

According to the fabrication method of the embodiment 2, the thin film transistor which possesses the normal mobility constitutes a pixel circuit in the pixel region on the active matrix substrate of the display device. Then, various circuits are constituted by using the thin film transistor which possesses high mobility in the drive circuit region which requires the high-speed data processing such as data driving circuits. Accordingly, it is possible to constitute the display device having the desired display performance without giving rise to the increase of the number of steps.

The above-mentioned embodiment 2 has been explained such that with respect to both of the respective first-time implantation and the second-time implantation, the insulation film is formed before the implantation and the insulation film is removed after the respective implantations. However, as mentioned previously, the insulation film may be formed only one of the first-time implantation and the second-time implantation and the insulation film may be removed after the implantation. Further, the insulation film which is formed before the first-time implantation may not be removed and may be held until the second implantation is completed.

Embodiment 3

FIG. 3A to FIG. 3F are cross-sectional views for explaining an embodiment 3 of a fabrication method of a display device according to the present invention and shows a fabrication process flow of an n-MOS top gate thin film transistor in the same manner as the embodiment 1.

In the embodiment 3, when the insulation film which is explained in FIG. 2D in the embodiment 2 is removed, a thin oxide film (a surface oxide film) 132 is formed on a surface of the a-Si film 104 before the ELA process. The surface oxide film 132 can be formed by, for example, ozone oxidation, oxygen plasma oxidation or the like. Hereinafter, the explanation is mainly made with respect to the process which makes this embodiment 3 differ from the second embodiment 2.

Figure 3A:
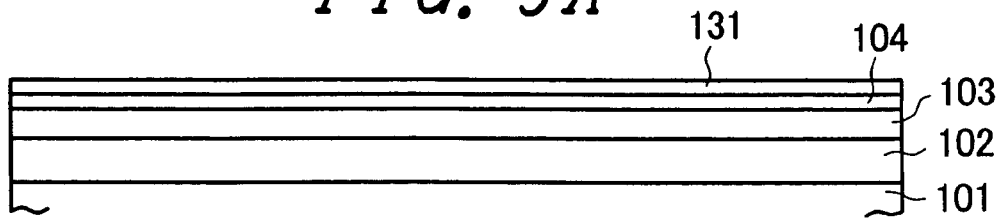
FIG. 3A to FIG. 3F describe a flow chart showing fabrication steps of a thin film transistor for explaining an embodiment 3 of a fabrication method of a display device according to the present invention in order.

FIG. 3A . . . An SiN layer 102 and an SiO$_2$ layer 103 are formed as a background layer on a glass substrate 101, and an amorphous silicon (a-Si) film 104 is formed on the SiN layer 102 and the SiO$_2$ layer 103 and, further, an SiO$_2$ film 131 is formed on the amorphous silicon film 104 by a plasma CVD method. The heat treatment is applied to the stacked structure to remove hydrogen in the inside of the a-Si film 104.

Figure 3B:
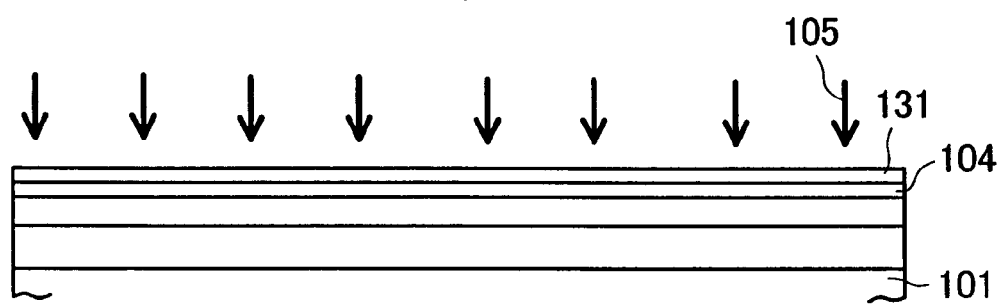

FIG. 3B . . . A dopant 105 (mainly B$^+$) for controlling a threshold voltage (Vth) of an n-MOS thin film transistor (TFT) using a polycrystalline (p-Si) semiconductor film is implanted into the a-Si film 104 through the SiO$_2$ film 131 (first implantation).

Figure 3C:
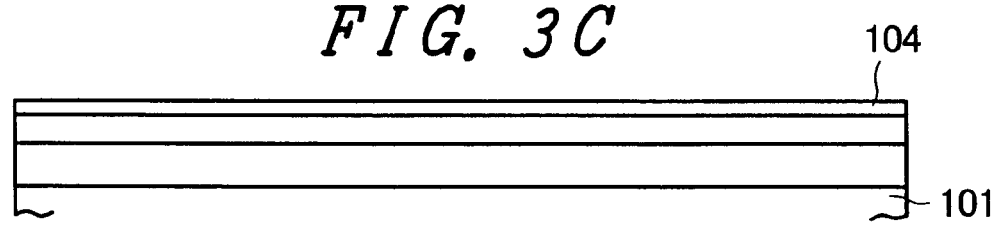

FIG. 3C . . . The a-Si film 104 is exposed by removing the SiO$_2$ film 131.

Figure 3D:
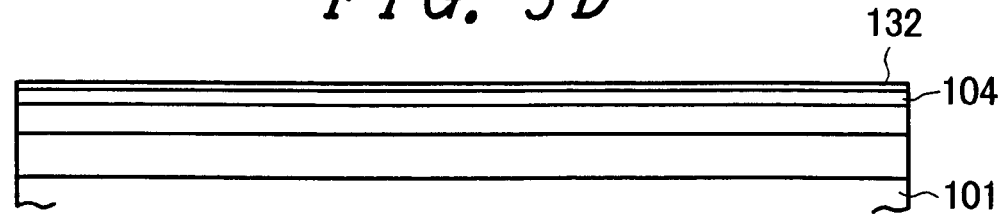

FIG. 3D . . . A thin surface oxide film 132 is formed by applying the oxidation treatment to the a-Si film 104 by oxygen plasma oxidation.

Figure 3E:
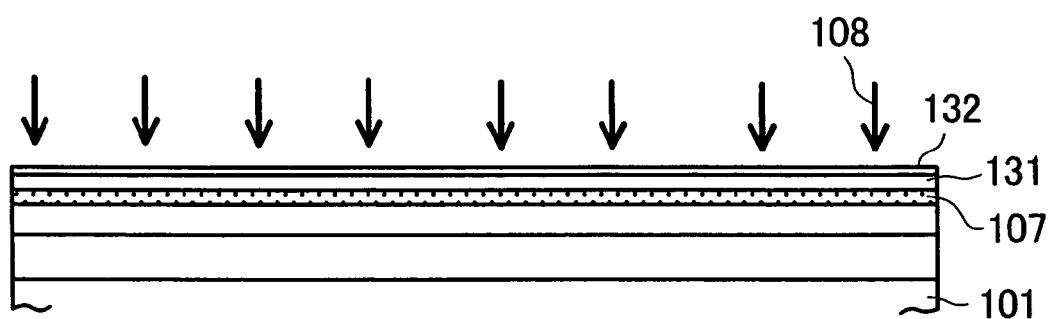

FIG. 3E . . . A dopant 108 for controlling a threshold voltage of an n-MOS pseudo-single-crystalline thin film transistor (TFT) is implanted into the p-Si film 107 through the surface oxide film 132 and the SiO$_2$ film 131 (second implantation).

Figure 3F:
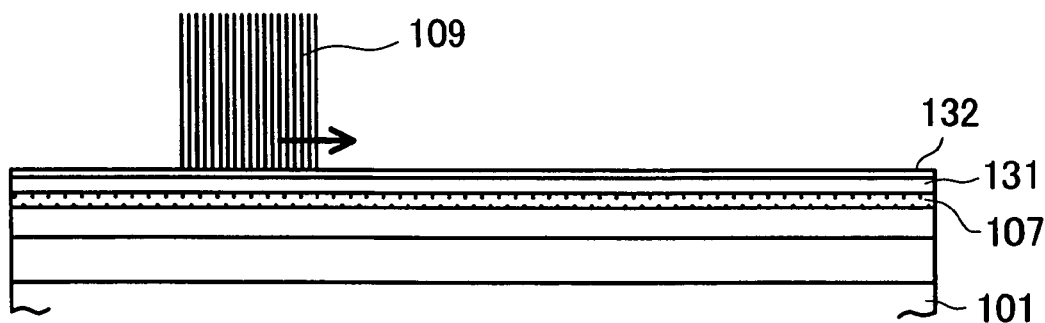

FIG. 3F . . . The pseudo-single-crystallization is performed by annealing a predetermined region of the p-Si film 107 with solid laser beams 109 or the like. The polycrystallization and the activation of the dopant 108 are simultaneously performed. The activation of the dopant 108 is performed only with respect to region which is annealed with laser beams. An arrow indicates the scanning direction of the laser beams for annealing. Hereinafter, by performing the process shown in FIG. 1G to FIG. 1W, it is possible to form the thin film transistors having different characteristics from each other which constitute channels being controlled at different threshold voltages by silicon semiconductor films which have different crystals on the same substrate.

In the embodiment 3, by forming the surface oxide film 132 on the SiO$_2$ film 131, it is possible to prevent undesired impurities other than the impurities which are implanted for controlling threshold value from being taken into thus controlling the threshold value of the thin film transistor to a desired value.

Usually, in performing the ELA crystallization, a natural oxide is formed on a surface of the a-Si film and hence, when the insulation film (the implantation through film or the contamination prevention film) is removed before the ELA crystallization, a thickness of the natural oxide film on the surface is decreased thus giving rise to a possibility that the contamination occurs in performing the ELA crystallization. According to the embodiment 3, it is possible to obviate such contamination thus enabling the acquisition of the highly reliable thin film transistor.

Figure 4:
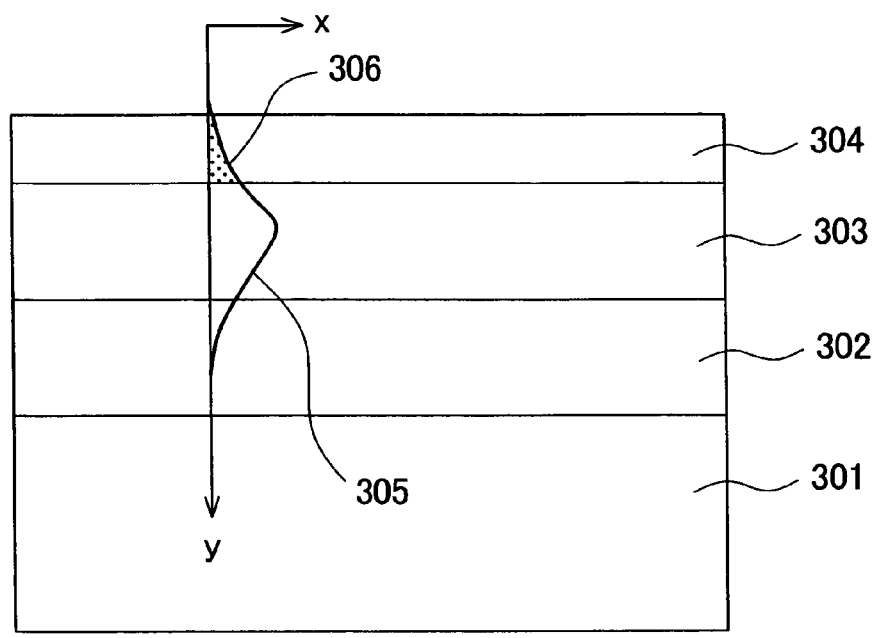
FIG. 4 is an explanatory view of a first example when the ion implantation of impurities in the fabrication method of the display device according to the present invention is performed.
Figure 5:
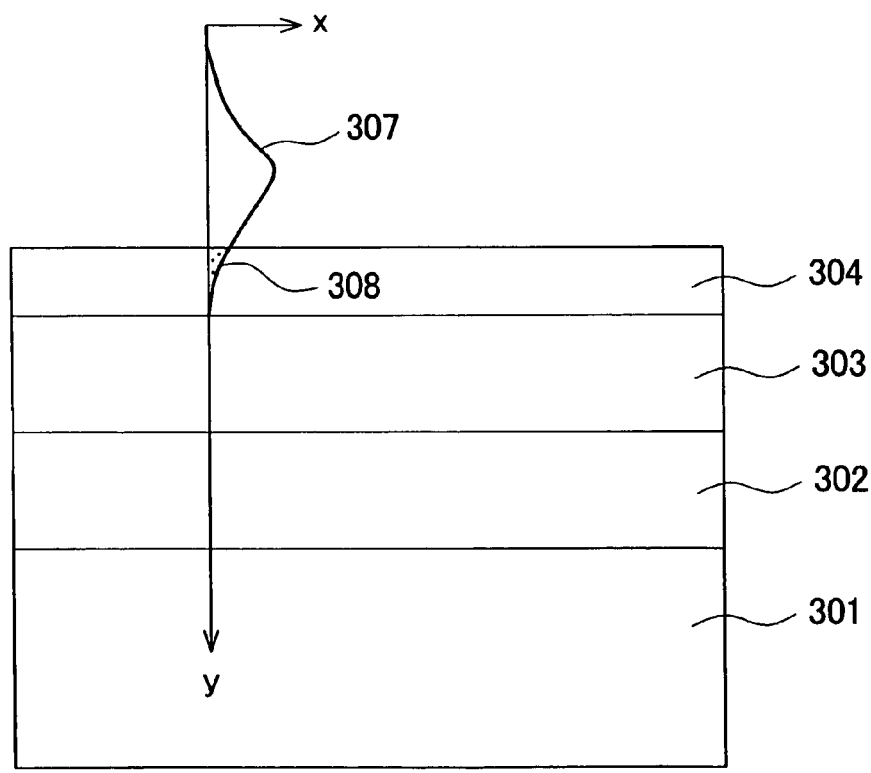
FIG. 5 is an explanatory view of a second example when the ion implantation of impurities in the fabrication method of the display device according to the present invention is performed.
Figure 6:
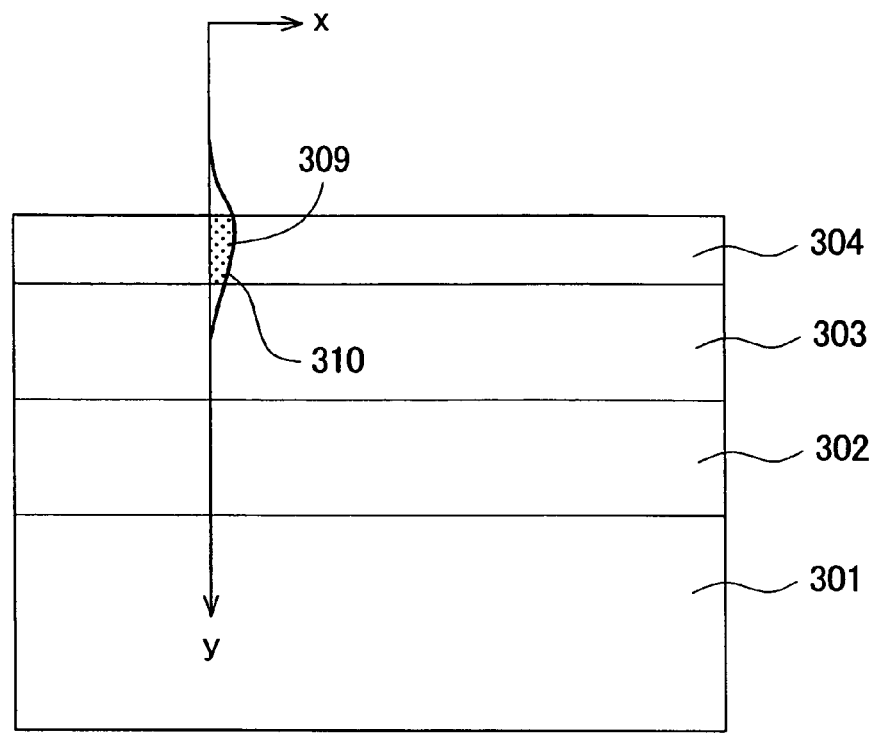
FIG. 6 is an explanatory view of a third example when the ion implantation of impurities in the fabrication method of the display device according to the present invention is performed.

Next, the relationship between the depth direction of the film thickness and a concentration profile of the dopant due to the implantation is explained. FIG. 4 is an explanatory view of the first example when the implantation of impurities in the fabrication method of the display device according to the present invention is performed. Further, FIG. 5 is an explanatory view of the second example when the implantation of impurities in the fabrication method of the display device according to the present invention is performed. Still further, FIG. 6 is an explanatory view of the third example when the implantation of impurities in the fabrication method of the display device according to the present invention is performed. In FIG. 4, FIG. 5, and FIG. 6, a background film (an SiN film 302, a SiO$_2$ film 303) is formed on a glass substrate 301, and a precursor film 304 (an a-Si film or a p-Si film) is formed on the background film.

All of FIG. 4, FIG. 5 and FIG. 6 correspond to the process of the embodiment 1 in which the implantation is directly applied to the precursor film 304 (the a-Si film or the p-Si film). FIG. 4 shows a case in which at the time of injecting the dopant, an implantation condition is decided such that a maximum quantity of the concentration profile 305 of the dopant in the depth direction (y direction) indicated by a height in the x direction is within the background film. A dose quantity 308 due to the implantation in the precursor film 304 indicated by meshed points in the drawing is activated to function as a dopant. The dose quantity 308 due to the implantation indicated by meshed points in the drawing performs both of the crystallization and hence, 90% of more of the dose quantity 308 is activated. Accordingly, a dopant quantity which is dosed into the precursor film 304 may be set to a small value.

FIG. 5 shows a case in which at the time of injecting the dopant, an implantation condition is decided such that a maximum quantity of the concentration profile 307 of the dopant in the depth direction (y direction) indicated by a height in the x direction is outside the precursor film 304. A dose quantity 308 due to the implantation in the precursor film 304 indicated by meshed points in the drawing is activated to function as a dopant. The dose quantity 308 due to the implantation indicated by meshed points in the drawing performs both of the crystallization and the activation and hence, 90% of more of the dose quantity 308 is activated. Also in this case, a dopant quantity which is dosed into the precursor film 304 may be set to a small value.

FIG. 6 shows a case in which at the time of injecting the dopant, an implantation condition is decided such that a maximum quantity of the concentration profile 309 of the dopant in the depth direction (y direction) indicated by a height in the x direction is within the precursor film 304. A total dose quantity is set smaller than the total dose quantity in the cases shown in FIG. 4 and FIG. 5. The dose quantity 309 due to the implantation in the precursor film 304 indicated by meshed points in the drawing is activated to function as a dopant. The dose quantity 309 due to the implantation indicated by meshed points in the drawing performs both of the crystallization and the activation and hence, 90% or more of the dose quantity 309 is activated.

Figure 7:
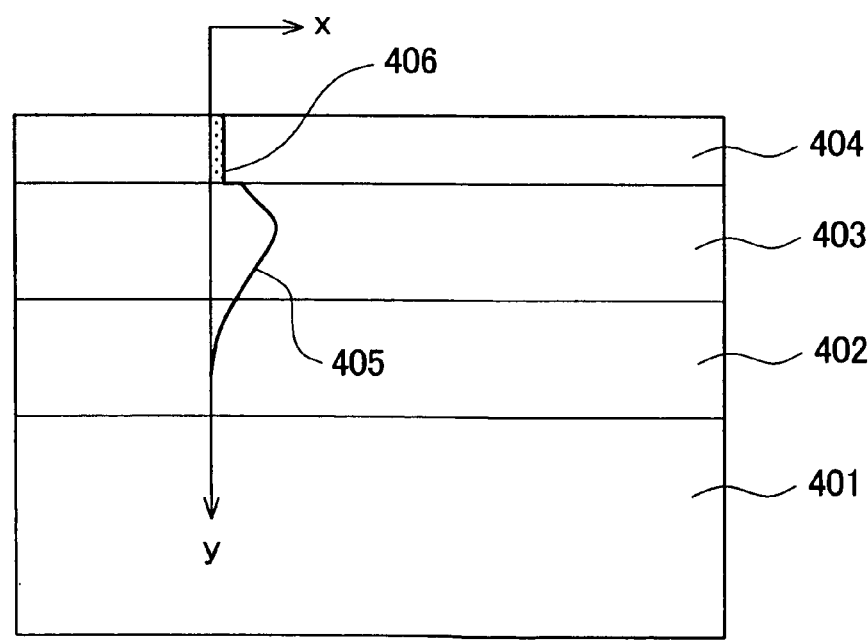
FIG. 7 is an explanatory view of a concentration profile of a dopant taken into the crystallized film after the crystallization by laser beams.

FIG. 7 is an explanatory view of the concentration profile of the dopant which is taken into the crystallized film after the crystallization by laser beams and the concentration profile of the dopant corresponds to the concentration profile of the dopant shown in FIG. 4. In FIG. 7, a background film (an SiN film 402, a SiO$_2$ film 403) is formed on a glass substrate 401, and a precursor film 404 (an a-Si film or a p-Si film) is formed on the background film. In the crystallization process after the dopant process, a maximum quantity of the concentration profile 405 is within the background film 403. With the radiation of laser beams, the precursor film 404 is melted and hence, the dopant in the inside of the precursor film 404 is taken into the crystallized film. Here, the concentration profile 406 of the dopant in the depth direction in the inside of the crystallized film becomes uniform.

Figure 8:
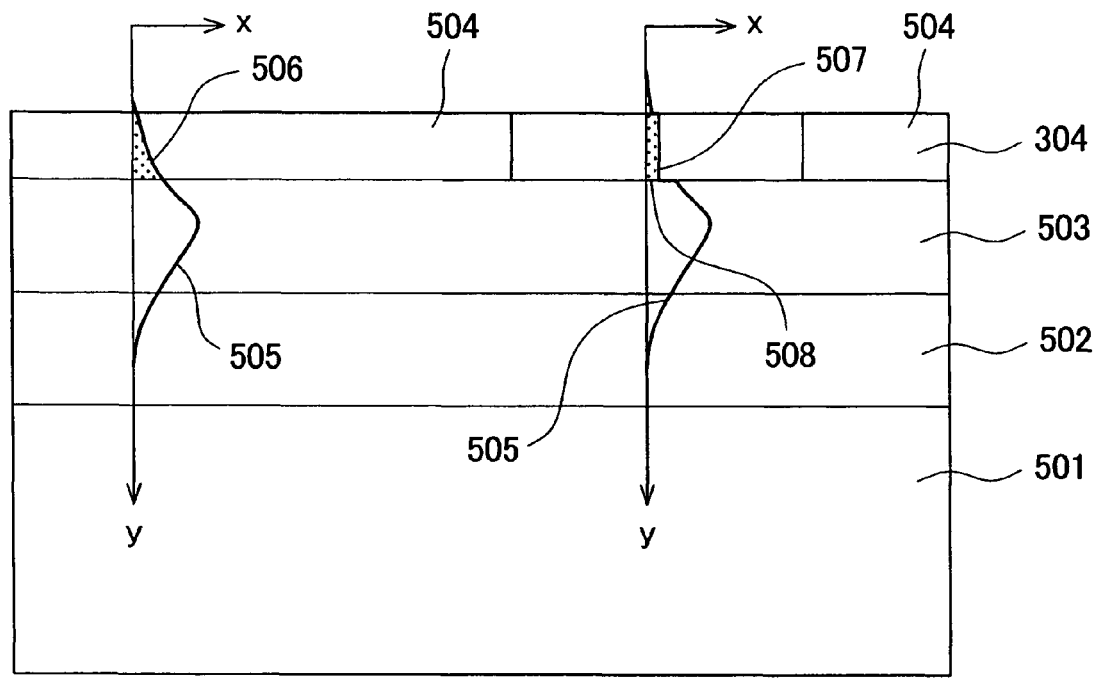
FIG. 8 is a view for explaining the difference in a concentration profile of a dopant in the depth direction of a silicon film in an actual product.

FIG. 8 is a view for explaining the difference in the dopant concentration profile in the depth direction of the silicon film in an actual product. In FIG. 8, a background film (an SiN film 502, an SiO$_2$ film 503) is formed on a glass substrate 501, and various regions are formed on the background film. Numeral 504 indicates a p-Si region and numeral 507 indicates a pseudo-single-crystalline region. Numeral 505 indicates an implantation concentration profile, numeral 506 indicates an implantation concentration profile in the inside of the p-Si region 504, and numeral 508 indicates the implantation concentration profile in the pseudo-single-crystalline regions 507.

In FIG. 8, the region 504 to which the crystallization by laser beams is not applied after performing the implantation exhibits the concentration distribution of the dopant indicated by numeral 506 in the depth direction. To the contrary, in the region 507 where the crystallization is selectively performed, the activation of the dopant is performed simultaneously with the crystallization and hence, the concentration profile 508 is fixed in the depth direction.

Figure 9:
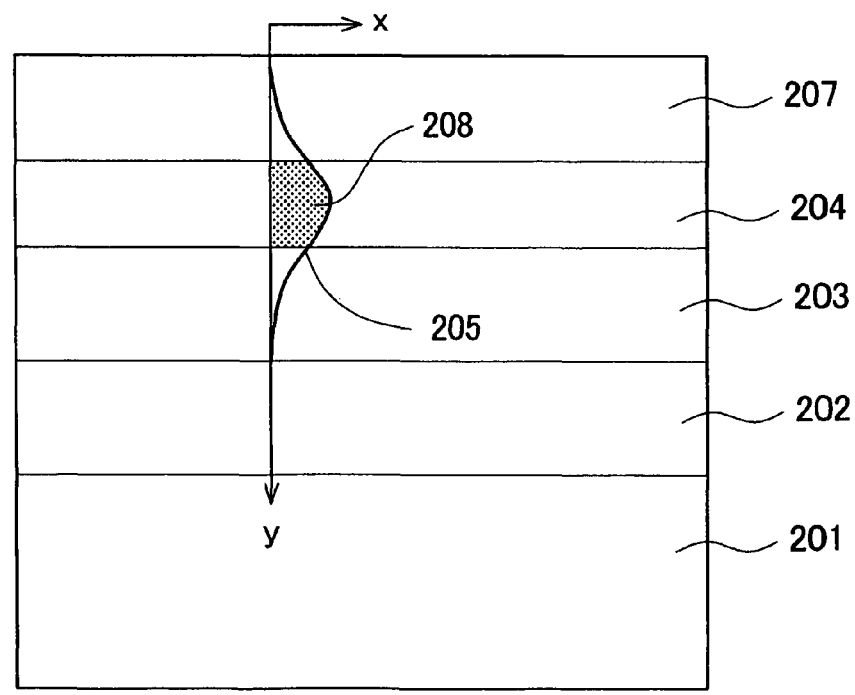
FIG. 9 is an explanatory view of a case in which the ion implantation is performed with a precursor film covered with an insulation film and also is a view corresponding to the above-mentioned embodiment 2.

FIG. 9 is an explanatory view of the case in which the implantation is performed by covering the precursor film with an insulation film from above and the case corresponds to the case explained in conjunction with the embodiment 2. In FIG. 9, on a glass substrate 201 on which an SiN film 202 and an SiO$_2$ film 203 are formed as a background film, an a-Si film or a p-Si film is formed as the precursor film 204, and an insulation film (an implantation through film or a contamination prevention film) 207 is formed in a state that the insulation film covers the background film. A dopant is dosed through the insulation film 207.

At the time of injecting the dopant, an implantation condition is decided such that a maximum quantity of the concentration profile 205 of the dopant in the depth direction (y direction) indicated by a height in the x direction is within the precursor film 204. A portion of dose quantity 208 due to the implantation in the precursor film 204 indicated by meshed points in the drawing is activated to function as a dopant.

Figure 10:
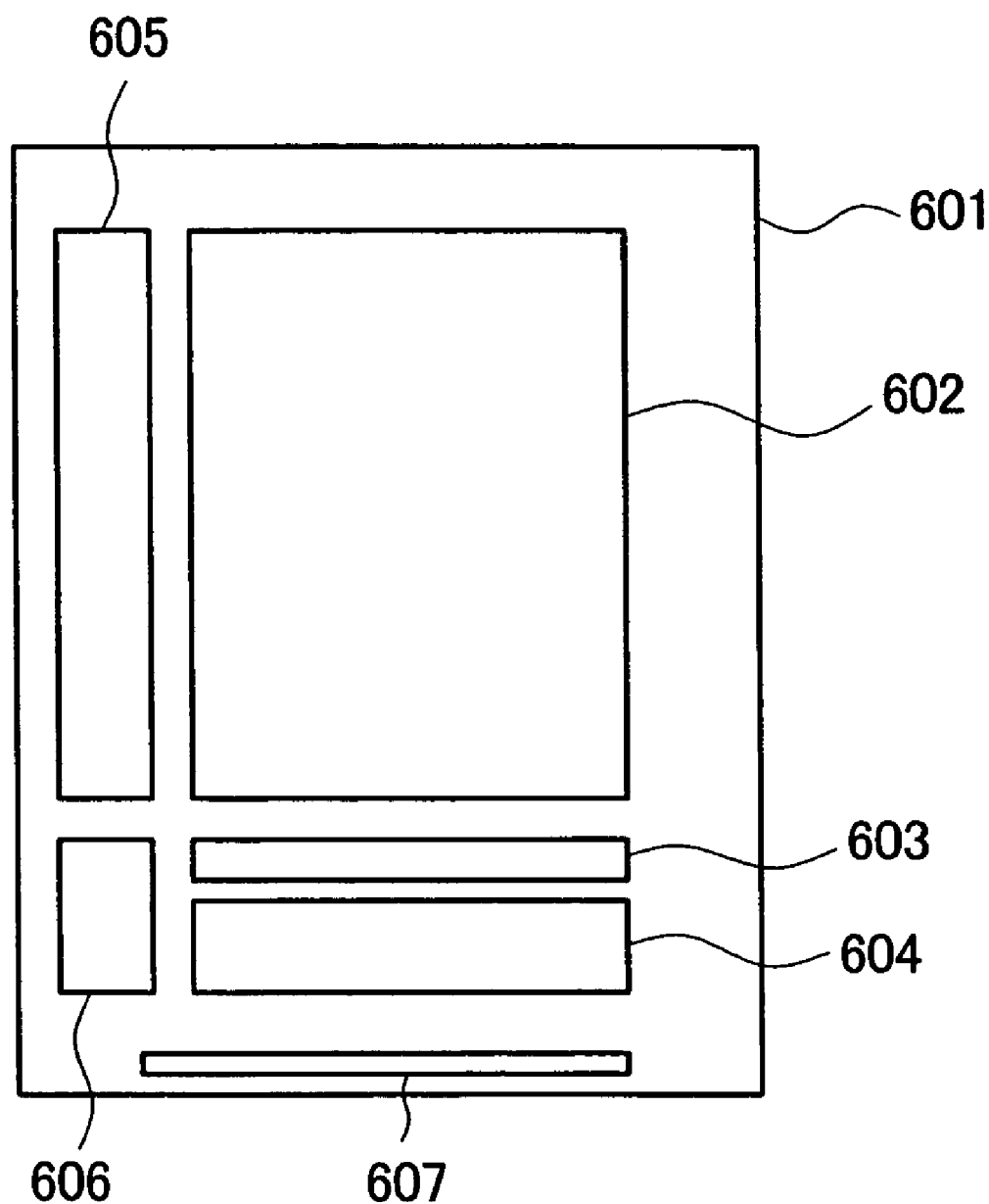
FIG. 10 is a plan view for schematically explaining one example of a thin film transistor substrate which constitutes a display device of the present invention.

FIG. 10 is a plan view for schematically explaining one example of a thin film transistor substrate which constitutes a display device of the present invention. The thin film transistor substrate (low-temperature poly-silicon TFT substrate) arranges a pixel region 602, peripheral circuits (video signal drive circuits (a signal processing circuit 603, a horizontal-direction scanning circuit 604), a scanning signal drive circuit (a vertical-direction scanning circuit 605), a booster circuit and other peripheral circuit 606), and an input pad 607 on a glass substrate 601 thereof.

In the signal processing circuit 603, the horizontal-direction scanning circuit 604 and other peripheral circuit 606 which require a high-speed operation, a thin film transistor which uses a pseudo-single-crystalline silicon semiconductor in a channel region is formed. In the pixel region 602 and the vertical-direction scanning circuit 605 which constitute other circuit parts, a thin film transistor which uses a poly-crystalline silicon semiconductor in a channel region is formed. However, the pseudo-single-crystalline silicon semiconductor may be also used in the vertical-direction scanning circuit 605 and the pixel region 602. Further, usual polycrystal may be also used in the signal processing circuit 603, the horizontal-direction scanning circuit 604 and other peripheral circuit 606. Here, in one circuit, a thin film transistor which uses a usual poly-crystalline silicon semiconductor and a thin film transistor which uses a pseudo-single-crystalline silicon semiconductor may be used in mixture.

Embodiment 4

Figure 11:
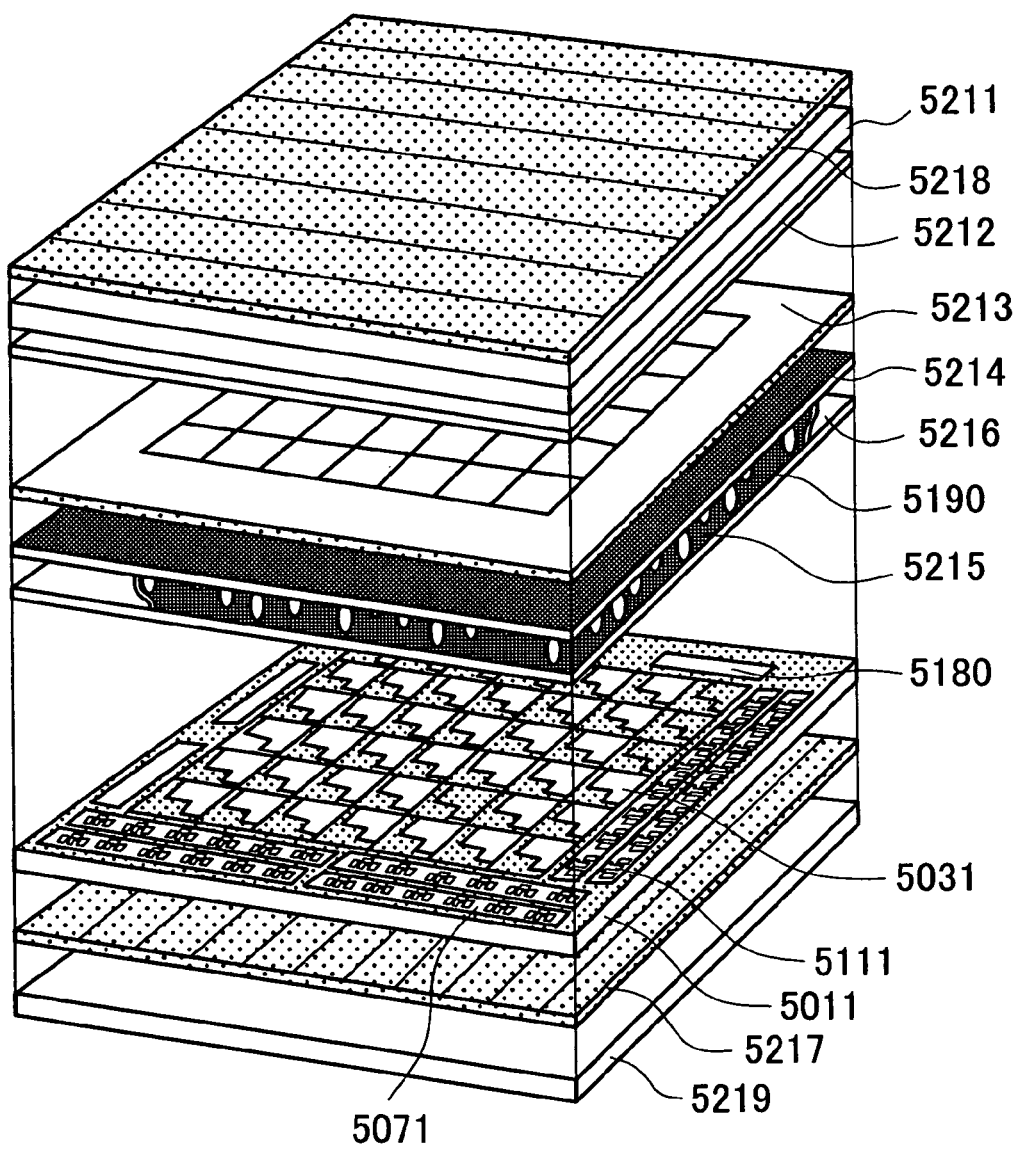
FIG. 11 is a schematic view for explaining a liquid crystal display device of an embodiment of a display device according to the present invention.

Next, the embodiment of the display device according to the present invention is explained as the fourth embodiment 4. FIG. 11 is a schematic view for explaining a liquid crystal display device which constitutes the embodiment of the present invention. On a glass substrate 5011, a plurality of pixel electrodes 5031 which are arranged in a matrix array, circuits 5071 and 5111 which input display signals to the pixel electrodes, and a group of other peripheral circuits 5180 which is necessary for image display are formed and, thereafter, an orientation film OR 5190 is applied by a printing method thus forming an active matrix substrate.

On the other hand, a color filter substrate which applies counter electrodes 5212, color filters 5213 and an orientation film 5214 onto a glass substrate 5211 thereof is prepared, and the color filter substrate is overlapped to the active matrix substrate. Liquid crystal 5215 is filled between the orientation films 5190, 5214 which face each other by vacuum injection and the liquid crystal is sealed by a sealing material 5216. Thereafter, polarizers 5217, 5218 are respectively adhered to outer surfaces of the glass substrate 5011 and the glass substrate 5211. Then, a backlight 5219 is arranged on a back surface of the active matrix substrate thus completing the liquid crystal display device.

Here, although the explanation has been made with respect to the liquid crystal display device which forms the color filters on the counter substrate side of the active matrix substrate, the present invention is also applicable to a liquid crystal display device of a type which forms color filters on an active matrix substrate side of the counter substrate. Further, although FIG. 11 shows the color filter substrate which is formed by stacking the counter electrodes 5212, the color filters 5213 and the orientation film 5214 on the glass substrate 5211 in this order, the color filter substrate may adopt the structure in which the color filters are formed on the glass substrate 5211, the counter electrodes 5212 are formed on the color filters, and the orientation film 5214 is formed as an uppermost layer. The position where the color filters are formed and the structure of the color filter substrate are not directly relevant to the technical concept of the present invention.

According to this embodiment, it is possible to directly form the pixels, the drive circuits which drive the pixels and other peripheral circuits on the active matrix substrate corresponding to required characteristics of these parts and hence, it is possible to acquire the liquid crystal display device having the favorable display quality which can enlarge the pixel region and exhibits the high-speed operation and the high resolution.

The present invention which has been explained heretofore is not limited to the liquid crystal display device and may be applicable to an organic EL display device and other various active-matrix-type display devices.

Further, with respect to the threshold value control due to doping of impurities to the semiconductor layer of the channel region of the thin film transistor, $B^+$ impurities are used for the n-type thin film transistor and $P^+$ impurities are used for the p-type thin film transistor in the embodiment. However, the impurities which are doped in the channel region are irrelevant to the decision of the conductive type of the thin film transistor and hence, $P^+$ impurities may be used for the n-type thin film transistor and $B^+$ impurities may be used for the p-type thin film transistor when necessary.

What is claimed is:

1. A fabrication method of a display device which forms a first thin film transistor which is formed in a first region and has a first threshold value, and a second thin film transistor which is formed in a second region and has a second threshold value which differs from the first threshold value, the fabrication method comprising:
   a semiconductor film forming step which forms a semiconductor film;
   a first impurity implanting step for implanting first impurities for a threshold value control in the semiconductor film which is formed in the first region and the second region;
   a first crystallizing step for performing the crystallization of the semiconductor film and the activation of the first impurities in the first region and the second region by applying heat treatment to the semiconductor film in the first region and the second region;
   a second impurity implanting step for implanting second impurities for a threshold value control in the semiconductor film in the first region and the second region after the first crystallizing step; and
   a second crystallizing step for performing the crystallization of the semiconductor film of the second region and the activation of the second impurities by applying heat treatment only to the semiconductor film in the second region out of the semiconductor films in the first region and the second region.

2. A fabrication method of a display device according to claim 1, wherein the first crystallizing step is a step in which the crystallization is performed by radiating laser beams to the semiconductor film.

3. A fabrication method of a display device according to claim 2, wherein the first crystallizing step is a step in which the crystallization is performed by radiating excimer laser beams or solid laser beams to the semiconductor film.

4. A fabrication method of a display device according to claim 1, wherein the first crystallizing step is a step in which the crystallization is performed by growing a solid phase by heating the semiconductor film.

5. A fabrication method of a display device according to claim 1, wherein the second crystallizing step is a step in which the crystallization is performed by radiating laser beams to the semiconductor film.

6. A fabrication method of a display device according to claim 5, wherein the second crystallizing step is a step in which the crystallization is performed by radiating continuous oscillation laser beams to the semiconductor film.

7. A fabrication method of a display device according to claim 5, wherein the second crystallizing step is a step in which the crystallization is performed by radiating continuous oscillation laser beams to the semiconductor film while modulating pulses.

8. A fabrication method of a display device according to claim 5, wherein the second crystallizing step is a step in which while continuous oscillation beams are radiated to the semiconductor film, the scanning of the continuous oscillation laser beams is performed by moving at least either one of a spot of the continuous laser beams or a substrate on which the semiconductor film is formed thus forming strip-like crystals.

9. A fabrication method of a display device according to claim 1, wherein the second impurity implanting step is a step in which the implantation is performed such that a peak position of the concentration of the second impurities is arranged outside the semiconductor film.

10. A fabrication method of a display device according to claim 1, wherein a dose quantity into the semiconductor film in the second impurity implanting step is smaller than a dose quantity in the first impurity implanting step.

11. A fabrication method of a display device according to claim 1, wherein at least one of the first impurities and the second impurities is implanted without an insulation film.

12. A fabrication method of a display device according to claim 1, wherein at least one of the first impurities and the second impurities may be implanted through the insulation film.

13. A fabrication method of a display device according to claim 12, wherein after at least one of the first impurities and the second impurities is implanted through the insulation film, the insulation film is removed before the crystallization of the semiconductor film.

14. A fabrication method of a display device according to claim 13, wherein the insulation film is removed after the first impurities are implanted through the insulation film and, then, after the removal of the insulation film, a surface oxide film is formed on a surface of the semiconductor film, and after the formation of the surface oxide film, the first crystallizing step is performed.

* * * * *